(12) United States Patent
Song et al.

(10) Patent No.: US 12,457,892 B2
(45) Date of Patent: Oct. 28, 2025

(54) FLEXIBLE TFT SUBSTRATE, FLEXIBLE DISPLAY PANEL, AND FLEXIBLE DISPLAY DEVICE

(71) Applicant: Shenzhen China Star Optoelectronics Semiconductor Display Technology Co., Ltd., Guangdong (CN)

(72) Inventors: Zhiwei Song, Guangdong (CN); Shuai Zheng, Guangdong (CN); Zhaosong Liu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/754,386

(22) PCT Filed: Mar. 4, 2022

(86) PCT No.: PCT/CN2022/079180
§ 371 (c)(1),
(2) Date: Mar. 31, 2022

(87) PCT Pub. No.: WO2023/155250
PCT Pub. Date: Aug. 24, 2023

(65) Prior Publication Data
US 2024/0114762 A1    Apr. 4, 2024

(30) Foreign Application Priority Data

Feb. 21, 2022  (CN) .......................... 202210157602.2

(51) Int. Cl.
*H10K 77/10*   (2023.01)
*H10K 59/126*  (2023.01)
*H10K 102/00*  (2023.01)

(52) U.S. Cl.
CPC ......... *H10K 77/111* (2023.02); *H10K 59/126* (2023.02); *H10K 2102/311* (2023.02)

(58) Field of Classification Search
CPC .............. H10K 77/111; H10K 59/126; H10K 2102/311; H10K 50/80; H10K 59/12; Y02E 10/549; G09F 9/301; G09F 9/33
See application file for complete search history.

(56) References Cited

U.S. PATENT DOCUMENTS

2012/0146041 A1*  6/2012  Han ................... H10K 50/8426
                                                         257/40
2019/0123121 A1*  4/2019  Liu ................... H01L 21/02565
(Continued)

FOREIGN PATENT DOCUMENTS

CN    108288637 A    7/2018
CN    109786430 A    5/2019
(Continued)

OTHER PUBLICATIONS

Chinese Office Action issued in corresponding Chinese Patent Application No. 202210157602.2 dated Nov. 13, 2024, pp. 1-7.
(Continued)

*Primary Examiner* — Robert G Bachner

(57) ABSTRACT

Discussed are a flexible thin film transistor (TFT) substrate, a flexible display panel and a flexible display device. The flexible TFT substrate of the present application can improve bending resistance of the flexible TFT substrate by arranging a concave structure in the bonding region and placing an organic material in the concave structure. When the bonding region is bent, a width of the bonding region can be reduced. Accordingly, a bezel width of the flexible display panel including the flexible TFT substrate is reduced, and a narrow bezel design is realized.

12 Claims, 2 Drawing Sheets

(56) References Cited

U.S. PATENT DOCUMENTS

2020/0203642 A1  6/2020  Kim
2021/0028195 A1  1/2021  Xu

FOREIGN PATENT DOCUMENTS

| CN | 109887935 A | 6/2019 |
| CN | 111415968 A | 7/2020 |
| CN | 111755624 A | 10/2020 |
| CN | 112259555 A | 1/2021 |
| CN | 213069408 U | 4/2021 |

OTHER PUBLICATIONS

International Search Report in International application No. PCT/CN2022/079180, mailed on Nov. 23, 2022.
Written Opinion of the International Search Authority in International application No. PCT/CN2022/079180, mailed on Nov. 23, 2022.

\* cited by examiner

FLEXIBLE TFT SUBSTRATE, FLEXIBLE DISPLAY PANEL, AND FLEXIBLE DISPLAY DEVICE

FIELD OF DISCLOSURE

The present application relates to a field of display technology, and in particular, to a flexible thin film transistor (TFT) substrate, a flexible display panel, and a flexible display device.

DESCRIPTION OF RELATED ART

With the development of display devices, people have high standard requirements for the appearance of display devices. Narrow-bezel display devices look better than wide-bezel display devices, which makes users have more immersive experiences and enjoy spectacular viewing experiences. In addition, when a large screen adopts multiple displays spliced together, narrow-bezel displays can be almost seamlessly connected, so as to achieve a better splicing result. Therefore, there has been a trend toward narrow-bezel display devices.

At present, the narrow-bezel display products among flexible display panels are usually realized in the following manner. Bending a bonding region located at an edge of the flexible display panel to reduce a width of the bonding region. A width of the bonding region is an important factor in determining a bezel width of the display panel. Consequently, a bezel of the flexible display panel is reduced when the width of the bonding region is reduced, and accordingly, a narrow bezel design is realized. However, in a process of bending the bonding region of the flexible display panel, the panel is easily damaged or broken.

SUMMARY

The present application provides a flexible thin film transistor (TFT) substrate, a flexible display panel, and a flexible display device. The flexible TFT substrate can be used in the flexible display panel, so that the flexible display panel can realize a narrow bezel design. The flexible TFT substrate has better bending resistance, so the flexible display panel comprising the flexible TFT substrate has improved bending resistance.

In a first aspect, the present application provides a flexible TFT substrate, wherein a display region and a bonding region are defined on the flexible TFT substrate, the bonding region is arranged on a periphery of the display region, the display region includes a TFT region, a TFT is disposed in the TFT region, a plurality of concave structures are disposed in the bonding region, and an organic material is disposed in the concave structures.

In some embodiments, the flexible TFT substrate includes a first flexible substrate, a first barrier layer, a second flexible substrate, a first adhesive layer, and a second barrier layer, a second adhesive layer, a buffer layer, a semiconductor layer, a gate insulating layer, a gate, an interlayer dielectric layer, and a conductive layer which are stacked in sequence; the conductive layer includes a source and a drain arranged in the TFT region; the semiconductor layer includes an active layer disposed in the TFT region; the active layer is arranged corresponding to the gate; the active layer includes a channel region and a source contact region and a drain contact region at two ends of the channel region; the source is electrically connected to the source contact region via a source contact hole defined in the interlayer dielectric layer; the drain is electrically connected to the drain contact region through a drain contact hole defined in the interlayer dielectric layer; and the gate, the active layer, the source, and the drain together constitute the TFT.

In some embodiments, the plurality of concave structures include a plurality of first grooves; each of the first grooves extends through the interlayer dielectric layer, the buffer layer, the second adhesive layer, the second barrier layer, and the first adhesive layer; and a bottom of each of the first grooves is a surface on one side of the second flexible substrate away from the first barrier layer.

In some embodiments, the plurality of concave structures include a plurality of second grooves; each of the second grooves extends through the interlayer dielectric layer, the buffer layer, the second adhesive layer, the second barrier layer, the first adhesive layer, the second flexible substrate, and the first barrier layer; and a bottom of each of the second grooves is a surface on one side of the first flexible substrate facing the first adhesive layer.

In some embodiments, the display region further includes a capacitor region; the conductive layer further includes a first storage capacitor electrode arranged in the capacitor region; the semiconductor layer includes a second storage capacitor electrode arranged in the capacitor region; and the first storage capacitor electrode is arranged corresponding to the second storage capacitor electrode, such that a first storage capacitor is formed between the first storage capacitor electrode and the second storage capacitor electrode.

In some embodiments, a metal layer is disposed between the second adhesive layer and the buffer layer; the metal layer includes a light shielding element disposed in the TFT region and a third storage capacitor electrode disposed in the capacitor region; the light shielding element is disposed corresponding to the active layer, such that the active layer is shielded by the light shielding element; the third storage capacitor electrode is an ion-doped semiconductor material; and the third storage capacitor electrode is arranged corresponding to the second storage capacitor electrode, such that a second storage capacitor is formed between the third storage capacitor electrode and the second storage capacitor electrode.

In some embodiments, a material of the first barrier layer includes silicon oxide, a material of the first adhesive layer includes silicon oxide, a material of the second barrier layer includes silicon nitride, and a material of the second adhesive layer includes silicon oxide.

In some embodiments, a connecting element is disposed on a surface in the bonding region, the connecting element connects a circuit board, the connecting element is disposed corresponding to one of the concave structures and is disposed above the organic material, and the connecting element is electrically connected to the TFT.

In some embodiments, the flexible TFT substrate includes multiple concave structures disposed in the bonding region and arranged in sequence in a direction from the display region to the bonding region.

According to some embodiments, in the concave structures arranged in sequence, the connecting element is correspondingly disposed above one of the concave structures farthest from the display region.

In some embodiments, the organic material disposed in the concave structures includes polyimide.

In a second aspect, the present application provides a flexible display panel, including:
a flexible TFT substrate, wherein the flexible TFT substrate is the flexible TFT substrate mentioned above; and a light emitting device, wherein the light emitting device is electrically connected to the TFT in the flexible TFT substrate.

In a third aspect, the present application provides a flexible display device. The flexible display device includes the flexible display panel mentioned above.

ADVANTAGES

In the flexible TFT substrate of the present application, the concave structure is arranged in the bonding region, and the organic material is disposed in the concave structure. In bending the bonding region of the flexible TFT substrate, the organic material in the concave structure can buffer stress and prevent damage or breakage of the flexible TFT substrate. Especially, when a bending position is located directly corresponding to the concave structure, a stress generated by bending is concentrated in the organic material in the concave structure. Since the organic material has good bending resistance, the flexible TFT substrate has improved bending resistance. When the bonding region is bent, a width of the bonding region is reduced, and a bezel width of the flexible display panel including the flexible TFT substrate is reduced to realize a narrow bezel design.

BRIEF DESCRIPTION OF DRAWINGS

In order to more clearly illustrate the embodiments of the present application, figures which will be described in the embodiments are briefly introduced hereinafter. It is obvious that the drawings are merely for the purposes of illustrating some embodiments of the present application, and a person having ordinary skill in this field can obtain other figures according to these figures without inventive work.

For a more complete understanding of the present application and its advantages, the following description is made with reference to the accompanying drawings. The same reference numerals denote the same parts in the following description.

DETAILED DESCRIPTION OF EMBODIMENTS

Technical solutions of the present application are clearly and completely described below with reference to accompanying drawings and in conjunction with specific embodiments. Obviously, the described embodiments are only some of the embodiments of the present application, rather than all the embodiments. Based on the embodiments in the present application, all other embodiments obtained by those skilled in the art without creative work shall fall within the protection scope of the present application. In addition, it should be understood that the specific embodiments described herein are only used to illustrate and explain the present application, but not to limit the present application.

Figure 1:
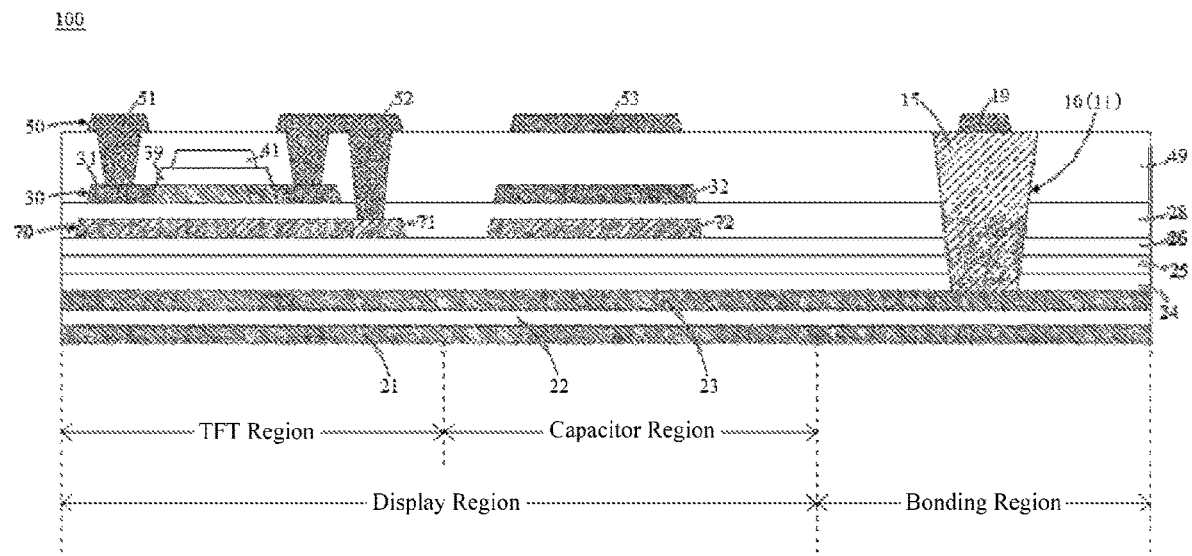
FIG. 1 is a first schematic view illustrating a flexible thin film transistor (TFT) substrate according to one embodiment of the present application.
Figure 2:
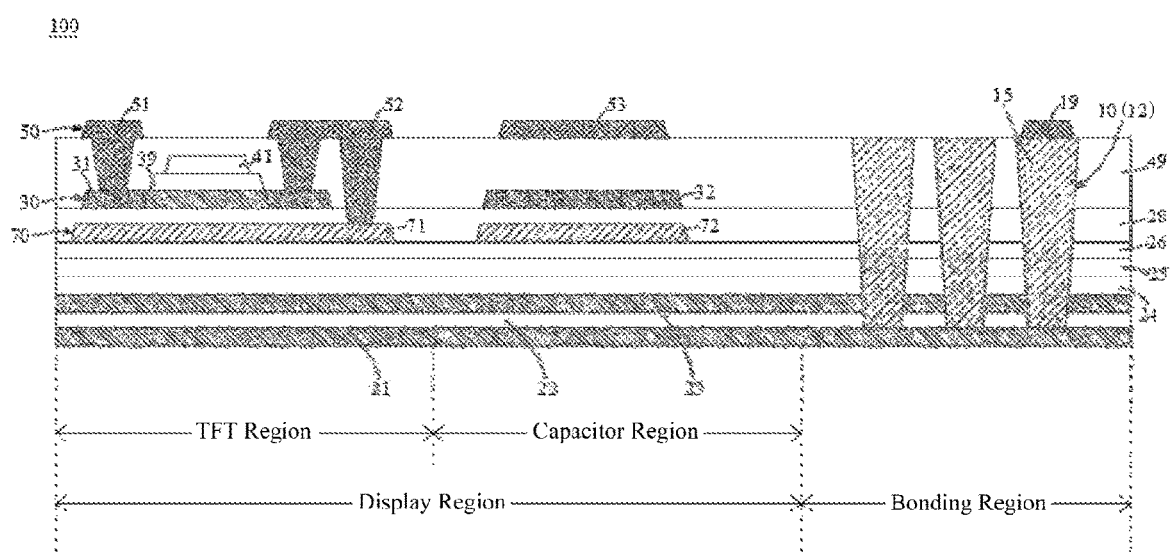
FIG. 2 is a second schematic view illustrating the flexible TFT substrate according to one embodiment of the present application.

Please refer to FIGS. 1 and 2. FIG. 1 is a first schematic view illustrating a flexible thin film transistor (TFT) substrate according to one embodiment of the present application, and FIG. 2 is a second schematic view illustrating the flexible TFT substrate according to one embodiment of the present application. The present application provides a flexible TFT substrate 100. The flexible TFT substrate 100 includes a display region and a bonding region. The bonding region is arranged at a periphery of the display region, the display region includes a TFT region, a TFT is arranged in the TFT region, a plurality of concave structures 10 are arranged in the bonding region, and an organic material 15 is disposed in the concave structures 10.

It can be understood that the bonding region refers to an area of the flexible TFT substrate 100 for connecting with a circuit board, and is usually located at an edge of the flexible TFT substrate 100. Exemplarily, the circuit board can be a chip on film (COF). Exemplarily, the present application includes one or multiple concave structures 10 in the bonding region.

It should be noted that, in the flexible TFT substrate 100 of the present application, the concave structure 10 is arranged in the bonding region, and the organic material 15 is filled in the concave structure 10. In bending the bonding region of the flexible TFT substrate 100, the organic material 15 in the concave structure 10 can buffer stress and prevent damage or breakage of the flexible TFT substrate 100. Especially, when a bending position is located directly corresponding to the concave structure 10, a stress generated by bending is concentrated in the organic material in the concave structure 10. Since the organic material 15 has good bending resistance, the flexible TFT substrate 100 has improved bending resistance. When the bonding region is bent, a width of the bonding region is reduced, and a bezel width of a flexible display panel 200 including the flexible TFT substrate 100 is reduced to realize a narrow bezel design.

Please refer to FIG. 1 and FIG. 2. A connecting element 19 is disposed on a surface in the bonding region. The connecting element 19 is used to connect the circuit board. The connecting element 19 is disposed corresponding to the concave structure 10 and is disposed above the organic material 15. The connecting element 19 is electrically connected to the TFT.

Referring to FIG. 1 and FIG. 2, the flexible TFT substrate 100 can include a first flexible substrate 21, a first barrier layer 22, a second flexible substrate 23, a first adhesive layer 24, and a second barrier layer 25, a second adhesive layer 26, a buffer layer 28, a semiconductor layer 30, a gate insulating layer 39, a gate 41, an interlayer dielectric layer 49, and a conductive layer 50 that are stacked in sequence.

The conductive layer 50 includes a source 52 and a drain 51 arranged in the TFT region. The semiconductor layer 30 includes an active layer 31 disposed in the TFT region. The active layer 31 is arranged corresponding to the gate 41. The active layer 31 includes a channel region and a source contact region and a drain contact region at two ends of the channel region. The source 52 is electrically connected to the source contact region through a source contact hole defined in the interlayer dielectric layer 49. The drain 51 is electrically connected to a drain contact region through a drain contact hole defined in the interlayer dielectric layer 49. The gate 41, the active layer 31, the source 52, and the drain 51 together constitute the TFT.

Exemplarily, a material of the semiconductor layer 30 is an oxide semiconductor. In some embodiments, a material of the semiconductor layer 30 can include one or more of indium gallium zinc oxide (IGZO), zinc tin oxide (ZTO), or indium tin zinc oxide (ITZO). In the present application, multiple refers to two or more than two, such as three, four, five, six, and the like.

Exemplarily, the source contact region and the drain contact region in the active layer 31 are both ion-doped regions, and doped ions in the ion-doped region can be N-type ions (e.g., phosphorus ions, arsenic ions), and the channel region is an undoped region.

Exemplarily, a material of the first flexible substrate 21 and a material of the second flexible substrate 23 are both polymer materials, such as polyimide (PI).

Please refer to FIG. 1 and FIG. 2. The concave structures 10 can include a plurality of first grooves 11 or a plurality of a second groove 12 or both the plurality of first grooves 11 and the plurality of second grooves 12. That is to say, when there is only one concave structure 10 in the bonding region, the concave structure 10 can be the first groove 11 or the second groove 12. When there are multiple concave structures 10 in the bonding region, the multiple concave structures 10 can all be the first grooves 11, or the multiple concave structures 10 can all be the second grooves 12, or the multiple concave structures 10 can include the plurality of first grooves 11 and the plurality of second grooves 12.

Referring to FIG. 1, the first groove 11 can extend through the interlayer dielectric layer 49, the buffer layer 28, the second adhesive layer 26, the second barrier layer 25, and the first adhesive layer 24. A bottom of the first groove 11 is a surface on one side of the second flexible substrate 23 away from the first barrier layer 22.

It can be understood that, since the interlayer dielectric layer 49, the buffer layer 28, the second adhesive layer 26, the second barrier layer 25, and the first adhesive layer 24 which are penetrated by the first groove 11 00 are all inorganic layers. The first groove 11 can be formed by one etching process, so a manufacturing process is relatively simple at a low cost.

Referring to FIG. 2, the second groove 12 can extend through the interlayer dielectric layer 49, the buffer layer 28, the second adhesive layer 26, the second barrier layer 25, the first adhesive layer 24, the second flexible substrate 23, and the first barrier layer 22. A bottom of the second groove 12 is a surface on one side of the first flexible substrate 21 facing the first adhesive layer 24.

It can be understood that the second groove 12 extends through all the inorganic layers (the interlayer dielectric layer 49, the buffer layer 28, the second adhesive layer 26, the second barrier layer 25, the first adhesive layer 24, and the first barrier layer 22), and also extends through the second flexible substrate 23, so that at a position of the second groove 12, the flexible TFT substrate 100 only has the first flexible substrate 21 and the organic material 15 located above the first flexible substrate 21. The first flexible substrate 21 and the organic material 15 both have strong bending resistance. Therefore, when a bending position of the flexible TFT substrate 100 is arranged corresponding to the second groove 12, the bending-resistant material (the first flexible substrate 21 and the organic material 15) at this position can effectively buffer the bending stress and prevent the flexible TFT substrate 100 from being damaged or broken.

It can be understood that the first groove 11 in FIG. 1 extends through five structural layers (the interlayer dielectric layer 49, the buffer layer 28, the second adhesive layer 26, the second barrier layer 25, and the first adhesive layer 24), while the second groove 12 in FIG. 2 extends through seven structural layers (the interlayer dielectric layer 49, the buffer layer 28, the second adhesive layer 26, the second barrier layer 25, the first adhesive layer 24, the second flexible substrate 23, and the first barrier layer 22). That is to say, compared with the first groove 11 of FIG. 1, the second groove 12 of FIG. 2 penetrates more structural layers. In other words, a depth of the second groove 12 is deeper. Because the first groove 11 and the second groove 12 are filled with the organic material, the organic material can buffer stress when being bent. Compared with the first groove 11, the second groove 12 has better bending resistance.

In some embodiments, the concave structure 10 can also be a through hole, and the through hole penetrates through the interlayer dielectric layer 49, the buffer layer 28, the second adhesive layer 26, the second barrier layer 25, the first adhesive layer 24, the second flexible substrate 23, the first barrier layer 22, and the first flexible substrate 21, and the organic material is disposed in the through hole.

Referring to FIG. 2, multiple concave structures 10 arranged in sequence can be disposed in the bonding region in a direction from the display region to the bonding region. It can be understood that, by arranging the multiple concave structures 10 in sequence, the bending stress can be transmitted in sequence among the concave structures 10. That is to say, the bending stress can be dispersed by the concave structures 10. Compared with the solution in which only one concave structure 10 is disposed in the bonding region in the direction from the display region to the bonding region, the solution with multiple concave structures 10 can better improve the bending resistance of the flexible TFT substrate 100.

In the present application, "multiple" refers to two or more, for example, three, four, five, six, seven, eight, and the like.

In some embodiments, in the multiple concave structures 10 arranged in sequence, the connecting element 19 is disposed above the concave structure 10 farthest from the display region. This way, when the flexible TFT substrate 100 is bent, the bending position can be set to a position corresponding to other concave structure 10 that is closer to the display region, so as to prevent the connecting element 19 from being damaged or detached from the flexible TFT substrate 100 in situations where the bending position is arranged corresponding to the connecting element 19.

Referring to FIG. 2, it can be understood that, when in the flexible TFT substrate 100, multiple concave structures 10 are arranged in sequence in the bonding region in the direction from the display region to the bonding region, and all the multiple concave structures 10 are the second grooves 12, the bending resistance of the flexible TFT substrate 100 is maximized by the strong bending resistance of the second groove 12 and the bending stress dispersion ability of the second grooves 12.

Please refer to FIG. 1 and FIG. 2. The display region further includes a capacitor region. The conductive layer 50 further includes a first storage capacitor electrode 53 arranged in the capacitor region. The semiconductor layer 30 includes a second storage capacitor electrode 32 arranged in the capacitor region. The first storage capacitor electrode 53 is arranged corresponding to the second storage capacitor electrode 32, such that a first storage capacitor is formed between the first storage capacitor electrode 53 and the second storage capacitor electrode 32.

It can be understood that the first storage capacitor electrode 53 is electrically connected to the source 52, so that the first storage capacitor can charge the TFT and maintain an ON (turned-on) state of the TFT.

Please refer to FIG. 1 and FIG. 2. A metal layer 70 is disposed between the second adhesive layer 26 and the buffer layer 28. The metal layer 70 includes a light shielding element 71 disposed in the TFT region and a third storage capacitor electrode 72 disposed in the capacitor region. The light shielding element 71 is arranged corresponding to the active layer 31 to shield the active layer 31, the third storage capacitor electrode 72 is made of an ion-doped semiconductor material, and the third storage capacitor electrode 72 is arranged corresponding to the second storage capacitor electrode 32, such that a second storage capacitor is formed between the third storage capacitor electrode 72 and the second storage capacitor electrode 32.

It can be understood that the third storage capacitor electrode 72 is electrically connected to the source 52, so that the second storage capacitor can charge the TFT and maintain the ON state of the TFT. In the present application, by having the first storage capacitor and the second storage capacitor at the same time to charge the thin film transistor, an influence of leakage current on the TFT can be reduced or eliminated.

Please refer to FIG. 1 and FIG. 2. The connecting element 19 can be a portion of the conductive layer 50. That is to say, the conductive layer 50 can simultaneously include the source 52 and the drain 51 in the TFT region, and the first storage capacitor electrode 53 in the capacitor region, and the connecting element 19 in the bonding region.

Exemplarily, the source 52 can also be electrically connected to the light shielding element 71 through a via hole defined in the interlayer dielectric layer 49 and the buffer layer 28 to improve electrical properties of the TFT and cause a more stable channel current.

Exemplarily, the organic material 15 disposed in the concave structure 10 can be polyimide (PI). It can be understood that, because polyimide has better flexibility and strong bending resistance, it can effectively buffer the stress generated by bending, and improve the bending resistance of the flexible TFT substrate 100.

Exemplarily, the organic material 15 can be filled into the concave structure 10 by coating, and then the organic material coated on a surface of the flexible TFT substrate 100 (i.e., a surface of the interlayer dielectric layer 49) is removed by exposure and development.

Exemplarily, a material of the first barrier layer 22 is silicon oxide ($SiO_2$), a material of the first adhesive layer 24 is silicon oxide ($SiO_2$), a material of the second barrier layer 25 is silicon nitride ($SiN_x$), and a material of the second adhesive layer 26 is silicon oxide ($SiO_2$).

It can be understood that, the material of the first barrier layer 22 between the first flexible substrate 21 and the second flexible substrate 23 is silicon oxide, and silicon oxide not only blocks water, oxygen, and impurity ions, but also improves bonding between the first flexible substrate 21 and the second flexible substrate 23 due to strong adhesion of silicon oxide. By arranging the first adhesive layer 24 between the second flexible substrate 23 and the second barrier layer 25, the present application improves bonding between the second flexible substrate 23 and the second barrier layer 25. By disposing the second adhesive layer 26 between the second barrier layer 25 and the buffer layer 28, the present application improves bonding between the second barrier layer and the buffer layer 28. In addition, by setting the material of the second barrier layer 25 to be silicon nitride, since silicon nitride can better block water and oxygen than silicon oxide, water and oxygen barrier capability of the flexible TFT substrate 100 can be further improved on the basis of arranging the first barrier layer 22.

Exemplarily, a material of the buffer layer 28, a material of the gate insulating layer 39, and a material of the interlayer dielectric layer 49 include one or more of silicon nitride ($SiN_x$), silicon oxide ($SiO_x$), or silicon oxynitride ($SiO_xN_y$).

Exemplarily, a material of the gate 41 and a material of the conductive layer 50 are both metal. In some embodiments, the material of the gate 41, the material of the conductive layer 50, and a material of the metal layer 70 all include one or more of molybdenum (Mo), titanium (Ti), copper (Cu), and aluminum (Al).

Figure 3:
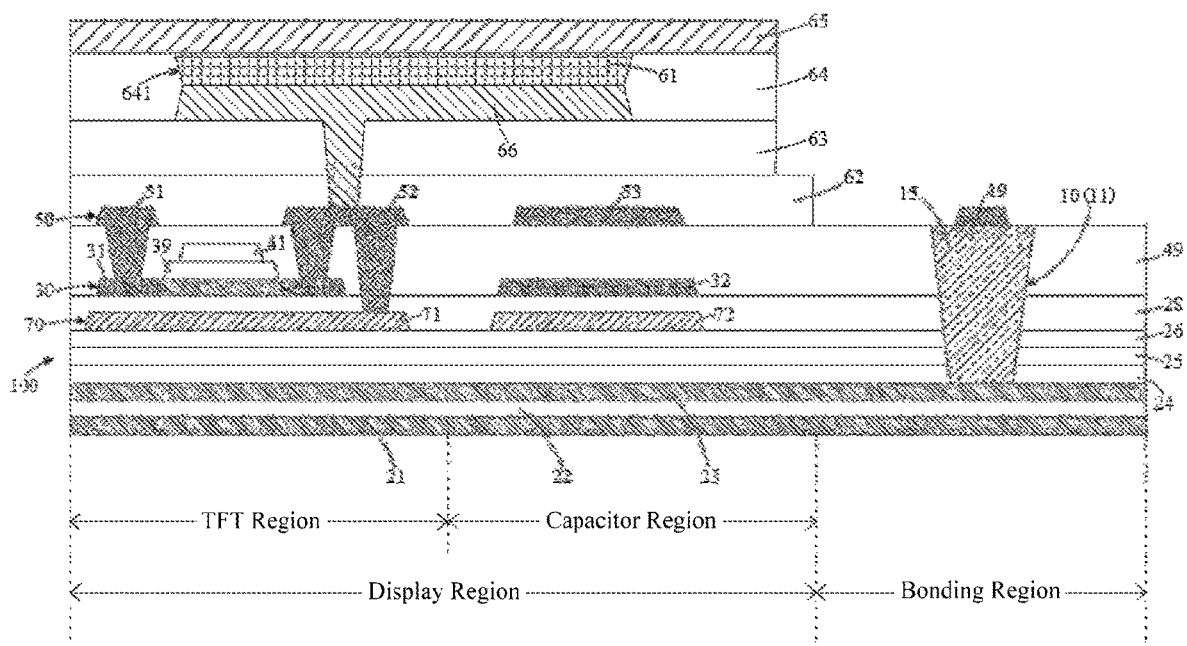
FIG. 3 is a first schematic view illustrating a flexible display panel according to one embodiment of the present application.
Figure 4:
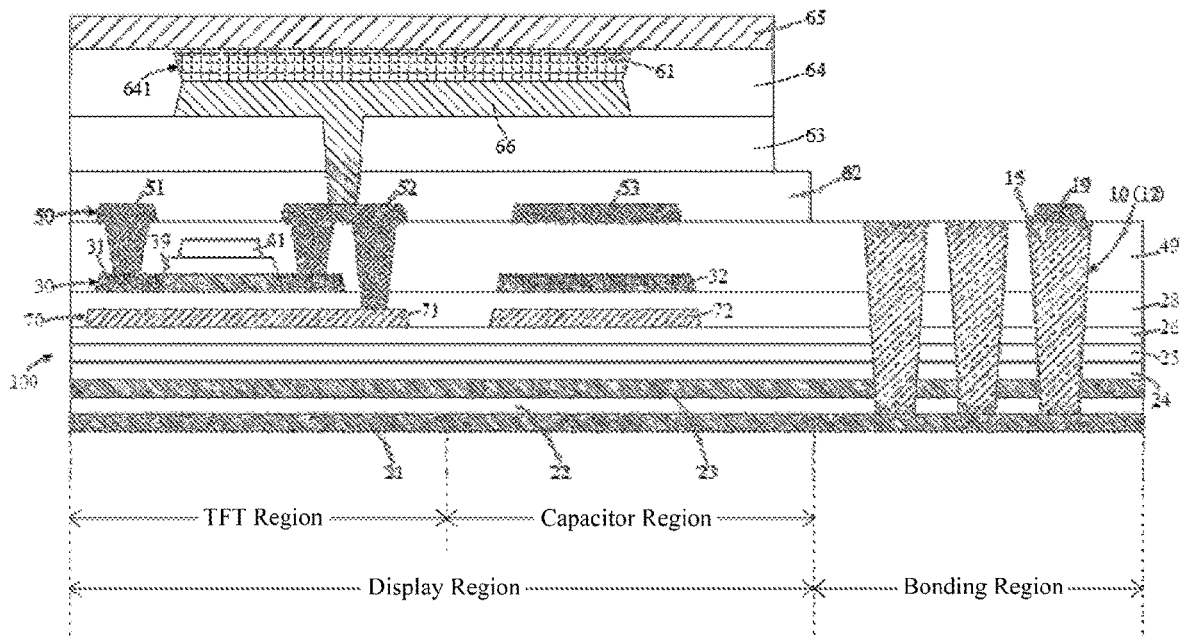
FIG. 4 is a second schematic view illustrating the flexible display panel according to one embodiment of the present application.

Please refer to FIGS. 3 and 4. FIG. 3 is a schematic view of the flexible display panel according to a first embodiment of the present application, and FIG. 4 is a schematic view of a second structure of a flexible display panel according to a second embodiment of the present application. The present application further provides a flexible display panel 200. The flexible display panel 200 includes a flexible TFT substrate 100 and a light emitting device 61. The flexible TFT substrate 100 can be the flexible TFT substrate 100 in any of the above embodiments, and the light emitting device 61 is electrically connected to the TFT in the flexible TFT substrate 100, so that the light emitting device 61 is driven by the TFT.

Please refer to FIG. 3 and FIG. 4. The flexible display panel 200 can further include a passivation layer 62, a planarization layer 63, a pixel definition layer 64, an anode 66, and a cathode 65. The passivation layer 62 is disposed on one side of the conductive layer 50 and one side of the interlayer dielectric layer 49 away from the buffer layer 28. The planarization layer 63 is disposed on one side of the passivation layer 62 away from the interlayer dielectric layer 49. The pixel definition layer 64 is disposed on one side of the planarization layer 63 away from the passivation layer 62. The pixel definition layer 64 is provided with an opening 641. The light emitting device 61 is arranged in the opening 641. The anode 66 and the cathode 65 are respectively arranged on two sides of the light emitting device 61. The anode 66 is arranged between the light emitting device 61 and the planarization layer 63. The anode 66 is connected to the source 52 through a via hole defined in the planarization layer 63 and the passivation layer 62. The cathode 65 is disposed on one side of the light emitting device 61 away from the anode 66.

Exemplarily, the light emitting device 61 is an organic light-emitting diode (OLED) device. In this case, the flexible display panel 200 is a flexible OLED display panel.

Exemplarily, a material of the planarization layer 63 and a material of the pixel definition layer 64 are both organic materials, such as organic photoresist materials.

Exemplarily, a material of the passivation layer 62 can include one or more of silicon nitride ($SiN_x$), silicon oxide ($SiO_x$), or silicon oxynitride ($SiO_xN_y$).

Exemplarily, a material of the anode 66 and a material of the cathode 65 can both include one or more of transparent conductive metal oxide or metal. Exemplarily, the transparent conductive metal oxide can be indium tin oxide (ITO), and the metal can be silver.

Exemplarily, the flexible display panel 200 can be produced on a rigid substrate (e.g., a glass substrate). After the production is completed, the flexible display panel 200 is irradiated with a laser from one side of the rigid substrate away from the flexible display panel 200 to weaken adhesion between the flexible display panel 200 and the rigid substrate (that is, weakling adhesion between the first flexible substrate 21 and the rigid substrate), and then the rigid substrate is removed from the flexible display panel 200.

The present application further provides a flexible display device, including the flexible display panel 200 in any of the foregoing embodiments.

Exemplarily, the flexible display device can further include a flexible circuit board, and the flexible circuit board is electrically connected to the connecting element 19. When the flexible display panel 200 is bent, the flexible circuit board and the bonding region of the flexible display panel 200 can be bent together, so as to reduce a width of the bonding region of the flexible display panel 200 and realize a narrow bezel design.

Exemplarily, the flexible circuit board can be a chip-on-film.

Exemplarily, the flexible display device can be a television, a mobile phone, a computer monitor, a tablet computer, an advertising display screen, a game device, an augmented reality (AR) device, a virtual reality (VR) device, a data storage device, an audio playback device, a video playback device, a wearable device, and other devices with display screens. The wearable device can be a smart bracelet, smart glasses, a smart watch, a smart decoration, etc.

The flexible TFT substrate, the flexible display panel, and the flexible display device have been described in detail above. The working principles and embodiments of the present application are described using specific examples. The descriptions of the above embodiments are only used for ease of understanding the present application. Those skilled in the art can change the embodiments and the application range according to the ideas of the present application. In summary, the present disclosure should not be construed as a limitation to the present application.

What is claimed is:

1. A flexible thin film transistor (TFT) substrate, wherein a display region and a bonding region are defined on the flexible TFT substrate, the bonding region is arranged on a periphery of the display region, the display region comprises a TFT region, a TFT is disposed in the TFT region, a plurality of concave structures are disposed in the bonding region, and an organic material is disposed in the concave structures,
wherein the flexible TFT substrate comprises a first flexible substrate, a first barrier layer, a second flexible substrate, a first adhesive layer, a second barrier layer, a second adhesive layer, a buffer layer, a semiconductor layer, a gate insulating layer, a gate, an interlayer dielectric layer, and a conductive layer stacked in sequence; the conductive layer comprises a source and a drain arranged in the TFT region; the semiconductor layer comprises an active layer disposed in the TFT region; the active layer is arranged corresponding to the gate; the active layer comprises a channel region and a source contact region and a drain contact region disposed at two ends of the channel region; the source is electrically connected to the source contact region via a source contact hole defined in the interlayer dielectric layer; the drain is electrically connected to the drain contact region through a drain contact hole defined in the interlayer dielectric layer; and the gate, the active layer, the source, and the drain together constitute the TFT.

2. A flexible display panel, comprising:
a flexible TFT substrate, wherein the flexible TFT substrate is the flexible TFT substrate of claim 1; and
a light emitting device, wherein the light emitting device is electrically connected to the TFT in the flexible TFT substrate.

3. The flexible display panel according to claim 2, wherein the plurality of concave structures comprises a plurality of second grooves; each of the second grooves extends through the interlayer dielectric layer, the buffer layer, the second adhesive layer, the second barrier layer, the first adhesive layer, the second flexible substrate, and the first barrier layer; and a bottom of each of the second grooves is a surface on one side of the first flexible substrate facing the first adhesive layer.

4. The flexible display panel according to claim 2, wherein the display region further comprises a capacitor region; the conductive layer further comprises a first storage capacitor electrode arranged in the capacitor region; the semiconductor layer comprises a second storage capacitor electrode arranged in the capacitor region; and the first storage capacitor electrode is arranged corresponding to the second storage capacitor electrode to form a first storage capacitor between the first storage capacitor electrode and the second storage capacitor electrode.

5. The flexible display panel according to claim 4, wherein a metal layer is disposed between the second adhesive layer and the buffer layer; the metal layer comprises a light shielding element disposed in the TFT region; the light shielding element is disposed corresponding to the active layer to shield the active layer; the third storage capacitor electrode is an ion-doped semiconductor material; and the third storage capacitor electrode is arranged corresponding to the second storage capacitor electrode to form a second storage capacitor between the third storage capacitor electrode and the second storage capacitor electrode.

6. The flexible display panel according to claim 2, wherein a material of the first barrier layer comprises silicon oxide, a material of the first adhesive layer comprises silicon oxide, a material of the second barrier layer comprises silicon nitride, and a material of the second adhesive layer comprises silicon oxide.

7. The flexible display panel according to claim 2, wherein a connecting element is disposed on a surface of the bonding region, the connecting element connects a circuit board, the connecting element is disposed corresponding to one of the concave structures and is disposed above the organic material, and the connecting element is electrically connected to the TFT.

8. A flexible display device, comprising a flexible display panel of claim 2.

9. A flexible display panel, comprising:
a flexible TFT substrate, wherein a display region and a bonding region are defined on the flexible TFT substrate, the bonding region is arranged on a periphery of the display region, the display region comprises a TFT region, a TFT is disposed in the TFT region, a plurality of concave structures are disposed in the bonding region, and an organic material is disposed in the concave structures; and
a light emitting device, wherein the light emitting device is electrically connected to the TFT in the flexible TFT substrate, and the light emitting device is an organic light-emitting diode (OLED) device;
wherein the plurality of concave structures comprises a plurality of second grooves; each of the second grooves extends through the interlayer dielectric layer, the buffer layer, the second adhesive layer, the second barrier layer, the first adhesive layer, the second flexible substrate, and the first barrier layer; and a bottom of each of the second grooves is a surface on one side of the first flexible substrate facing the first adhesive layer.

10. The flexible display panel according to claim 9, wherein the display region further comprises a capacitor region; the conductive layer further comprises a first storage capacitor electrode arranged in the capacitor region; the semiconductor layer comprises a second storage capacitor electrode arranged in the capacitor region; and the first storage capacitor electrode is arranged corresponding to the second storage capacitor electrode to form a first storage capacitor between the first storage capacitor electrode and the second storage capacitor electrode.

11. The flexible display panel according to claim 10, wherein a metal layer is disposed between the second adhesive layer and the buffer layer; the metal layer comprises a light shielding element disposed in the TFT region; the light shielding element is disposed corresponding to the active layer to shield the active layer; the third storage capacitor electrode is an ion-doped semiconductor material; and the third storage capacitor electrode is arranged corresponding to the second storage capacitor electrode to form a second storage capacitor between the third storage capacitor electrode and the second storage capacitor electrode.

12. The flexible display panel according to claim 9, wherein a material of the first barrier layer comprises silicon oxide, a material of the first adhesive layer comprises silicon oxide, a material of the second barrier layer comprises silicon nitride, and a material of the second adhesive layer comprises silicon oxide.

* * * * *